(12) United States Patent
Hosono et al.

(10) Patent No.: US 7,261,994 B2
(45) Date of Patent: Aug. 28, 2007

(54) POSITIVE RESIST COMPOSITION

(75) Inventors: Takayuki Hosono, Kawasaki (JP);
Koki Tamura, Kawasaki (JP); Daisuke Kawana, Kawasaki (JP); Tomotaka Yamada, Kawasaki (JP)

(73) Assignee: Tokyo Ohka Kogyo Co., Ltd. (JP)

( * ) Notice: Subject to any disclaimer, the term of this patent is extended or adjusted under 35 U.S.C. 154(b) by 51 days.

(21) Appl. No.: 11/091,617

(22) Filed: Mar. 28, 2005

(65) Prior Publication Data

US 2005/0227170 A1    Oct. 13, 2005

(30) Foreign Application Priority Data

Mar. 30, 2004   (JP) .............................. 2004-098183

(51) Int. Cl.
*G03F 7/039* (2006.01)
(52) U.S. Cl. ................. 430/270.1; 430/921; 430/914
(58) Field of Classification Search .................... None
See application file for complete search history.

(56) References Cited

U.S. PATENT DOCUMENTS

| | | | |
|---|---|---|---|
| 5,032,636 A * | 7/1991 | Ono et al. | 524/265 |
| 5,691,396 A * | 11/1997 | Takemura et al. | 522/62 |
| 5,731,126 A | 3/1998 | Takemura et al. | |
| 5,776,652 A * | 7/1998 | Eichhorn et al. | 430/163 |
| 6,066,433 A * | 5/2000 | Takemura et al. | 430/270.1 |
| 6,479,210 B2 * | 11/2002 | Kinoshita et al. | 430/270.1 |
| 6,939,664 B2 * | 9/2005 | Huang et al. | 430/270.1 |
| 6,969,577 B2 * | 11/2005 | Adegawa | 430/270.1 |
| 2002/0168581 A1 | 11/2002 | Takeda et al. | |
| 2003/0099899 A1 * | 5/2003 | Gronbeck et al. | 430/270.1 |
| 2003/0138727 A1 * | 7/2003 | Kawabe et al. | 430/270.1 |
| 2004/0229161 A1 * | 11/2004 | Yasunami et al. | 430/270.1 |
| 2004/0253535 A1 * | 12/2004 | Cameron et al. | 430/270.1 |
| 2006/0003252 A1 * | 1/2006 | Hirayama et al. | 430/170 |

FOREIGN PATENT DOCUMENTS

| | | | |
|---|---|---|---|
| EP | 1033624 A1 * | 9/2000 | |
| EP | 1457822 A2 * | 9/2004 | |
| EP | 1 643 307 A1 * | 4/2006 | |
| JP | 04-130324 | 5/1992 | |
| JP | 2001-51422 | 2/2001 | |
| WO | WO-02082185 A1 * | 10/2002 | |
| WO | WO-2004/111734 A1 * | 12/2004 | |

OTHER PUBLICATIONS

Dow Corning, "Silicone Chemistry Overview" 12 page brochure dated 1997, Dow Corning Corporation, Midland ,Michigan, downloaded from http://www.dowcorning.com/content/webabstract/ABS_51-960A-01.asp?DCWS=Paints%20and%20Inks&DCWSS=Resins%20and%20Binders on Jul. 13, 2006.*

* cited by examiner

*Primary Examiner*—Cynthia Hamilton
(74) *Attorney, Agent, or Firm*—Knobbe, Martens, Olson and Bear, LLP (57) ABSTRACT

A positive resist composition having excellent mask linearity is provided. This composition is a positive resist composition comprising a base resin component (A) and an acid generator component (B) generating an acid under exposure, wherein the base resin component (A) is a silicone resin and the acid generator component (B) contains an onium salt-based acid generator (B1) containing a perfluoroalkyl sulfonate ion having 3 or 4 carbon atoms as an anion.

9 Claims, 2 Drawing Sheets

POSITIVE RESIST COMPOSITION

BACKGROUND OF THE INVENTION

1. Field of the Invention

The present invention relates to a positive resist composition.

This application claims priority on Japanese Patent Application No. 2004-98183 filed in Japan, on Mar. 30, 2004, the disclosure of which is incorporated by reference herein.

2. Description of the Related Art

In the production of semiconductor devices and liquid crystal display devices, fine working has rapidly been developed, recently, with the progress of a lithography technique. A light source having a shorter wavelength is generally employed for fine working. Specifically, ultraviolet rays typified by g-rays and i-rays have conventionally been used, but now KrF excimer lasers (248 nm) and ArF excimer lasers (193 nm) have been introduced.

As one of the resist materials which satisfy the conditions of high definition capable of reproducing a pattern having a fine size, for example, there is known a chemically amplified resist composition comprising a base resin and an acid generator generating an acid under exposure, wherein alkali solubility changes due to an action of an acid generated from the acid generator.

As the base resin component of the chemically amplified resist, for example, there can be used polyhydroxystyrene having high transparency to a KrF excimer laser (248 nm), or those wherein a portion of hydroxyl groups are protected with an acid dissociable dissolution inhibiting group.

As the acid generator, for example, onium salt-based acid generators are now used most popularly. Among these acid generators, an onium salt-based acid generator wherein the anion moiety (acid) is a fluoroalkyl sulfonate ion containing an alkyl chain having 1 carbon atom (hereinafter referred to as "C1PAG") is mainly used and the other acid is not used popularly because of its low acid strength (see, for example, Patent Document 1).

[Patent Document 1] Japanese Patent Application, First Publication No. 2001-51422

However, a resist composition containing C1PAG has the problem that it is inferior in mask linearity (reproducibility of the mask). Therefore, when an Iso line pattern and a line-and-space (L&S) pattern are formed by using a mask having the same line width, the Iso line pattern has a line width smaller than that of the L&S pattern, thus causing a problem such as poor Iso/Dense balance wherein the (Iso) pattern and the (Dense) pattern differ in reproducibility of the mask.

SUMMARY OF THE INVENTION

Under these circumstances, the present invention has been made and an object thereof is to provide a positive resist composition which is excellent in mask linearity.

The present inventors have intensively studied and found that the above object is achieved by a positive resist composition wherein a silicone resin is used as a base resin and the silicone resin is used in combination with a specific acid generator, and thus the present invention has been achieved.

The present invention is directed to a positive resist composition comprising a base resin component (A) and an acid generator component (B) generating an acid under exposure, wherein the base resin component (A) is a silicone resin, and the acid generator component (B) contains an onium salt-based acid generator (B1) containing a perfluoroalkyl sulfonate ion having 3 or 4 carbon atoms as an anion.

In the present invention, the onium salt-based acid generator refers to an onium salt which contains a fluoroalkyl sulfonate ion as an anion and generates an acid (anion) under exposure. Exposure includes irradiation with an electron beam. The "constituent unit" means a monomer unit constituting a polymer.

The present invention provides a positive resist composition which is excellent in mask linearity.

DESCRIPION OF THE PREFERRED EMBODIMENTS

The present invention will now be described in more detail.

The positive resist composition of the present invention comprises a base resin component (A) (which hereinafter may be referred to as a component (A)) and an acid generator component (B) generating an acid under exposure (which hereinafter may be referred to as a component (B)).

In the positive resist composition, when an action of the acid generated from the component (B) is exerted, the entire positive resist composition, which is insoluble in an alkali, becomes soluble in an alkali. Therefore, when the positive resist composition applied onto a substrate is selectively exposed via a mask pattern in the formation of a resist pattern, alkali solubility of the exposed area increases, and thus alkali development can be attained.

Component (A)

A feature of the positive resist composition of the present invention is that the component (A) is a silicone resin.

The silicone resin is a resin having an organic group such as an alkyl group or an aryl group among polysiloxanes having a repeating structure of a siloxane bond in which a silicon atom and an oxygen atom are combined.

As the silicone resin, a silicone resin proposed as a base resin of a positive resist composition can be generally used and this includes, for example, a silsesquioxane resin having a constituent unit in which one silicon atom is combined with 3/2 oxygen atoms and one organic group.

In the present invention, the content (silicon content) of silicon atoms derived from the component (A) is preferably from 5 to 30% by weight, and more preferably from 8 to 20% by weight, based on the total solid content of the positive resist composition. When the content is not less than the lower limit, the excellent effects of the present invention are exerted. Also the resistance to dry etching such as oxygen plasma etching used in the case of etching of the substrate is improved. On the other hand, when the content is not more than the upper limit, good quantitative balance with the other components (finally, balance between various properties) is attained.

The silicon content can be adjusted by adjusting the silicon content of the silicone resin used in the component (A) and/or the amount of the component (A) in the positive resist composition.

In the present invention, examples of the component (A) include a resin component (A1) having an acid dissociable dissolution inhibiting group, the dissolution inhibiting group being dissociated by an action of an acid to thereby enhance alkali solubility, and an alkali soluble resin component (A2).

In the case in which the component (A) is the resin component (A1), the acid dissociable dissolution inhibiting group contained in the resin component (A1) is dissociated by the acid generated from the component (B), to thereby enhance alkali solubility of the exposed area.

In the case in which the component (A) is the resin component (A2), the positive resist composition of the present invention contains the below-mentioned low molecular weight dissolution inhibitor (C) having an acid dissociable dissolution inhibiting group, the acid dissociable dissolution inhibiting group being dissociated by an action of an acid. That is, the acid dissociable dissolution inhibiting group contained in the low molecular weight dissolution inhibitor (C) is dissociated by the acid generated from the component (B), to thereby enhance the alkali solubility of the exposed area.

Preferable examples of the resin component (A1) include the following silsesquioxane resin (A11) and silsesquioxane resin (A12).

Preferable examples of the resin component (A2) include the following silsesquioxane resin (A21).

Silsesquioxane Resin (A11)

The silsesquioxane resin (A11) comprises a constituent unit (a1) represented by the following general formula (I):

(I)

wherein $R^1$ represents a linear or branched alkylene group having 1 to 5 carbon atoms, a constituent unit (a2) represented by the following general formula (II):

(II)

wherein $R^2$ represents a linear or branched alkylene group having 1 to 5 carbon atoms, and $R^3$ represents an acid dissociable dissolution inhibiting group, and a constituent unit (a3) represented by the following general formula (III):

(III)

In the constituent unit (a1), $R^1$ is preferably a lower alkylene group having 1 to 5 carbon atoms, and is more preferably a methylene group in view of the synthesis of the resin. The position of the hydroxyl group may be any of the o-, m- and p-positions, and is preferably the p-position from industrial points of view.

In the constituent unit (a2), $R^2$ is also preferably a lower alkylene group having 1 to 5 carbon atoms, and more preferably a methylene group in view of the synthesis of the resin.

In the constituent unit (a2), $R^3$ is preferably an acid dissociable dissolution inhibiting group.

In the present invention, the term "acid dissociable dissolution inhibiting group" is a group which has alkali dissolution inhibiting properties capable of making the entire positive resist composition insoluble in an alkali before exposure, and which is dissociated due to an action of an acid generated from the component (B), thereby making the entire positive resist composition soluble in an alkali, in the process for formation of a resist pattern using the positive resist composition.

Therefore, when the resist composition containing the silsesquioxane resin (A11) is applied onto a substrate and then exposed via a mask pattern, alkali solubility of the exposed area is enhanced, and thus a resist pattern can be formed by alkali development.

$R^3$ may be an acid dissociable dissolution inhibiting group which can be substituted with a hydrogen atom of a phenolic hydroxyl group, and can be appropriately elected from various groups according to a light source to be used. Specific examples thereof include tertiary alkyloxycarbonyl groups such as a tert-butoxycarbonyl group and a tert-amyloxycarbonyl group; tertiary alkyl groups such as a tert-butyl group and a tert-amyl group; tertiary alkoxycarbonylalkyl groups such as a tert-butoxycarbonylmethyl group and a tert-butoxycarbonylethyl group; alkoxyalkyl groups such as a 1-ethoxyethyl group, a 1-isopropoxyethyl group, a 1-methoxy-1-methylethyl group, a 1-methoxypropyl group and a 1-n-butoxyethyl group; and cyclic ether groups such as a tetrahydropyranyl group and a tetrahydrofuranyl group.

Among these groups, an alkoxyalkyl group is preferable because elimination energy is low and dissolution contrast can be obtained with ease, thus making it possible to improve lithography characteristics. The number of carbon atoms of an alkoxy group in the alkoxyalkyl group is preferably from 1 to 3, and the number of carbon atoms of an alkyl group is preferably from 1 to 6. The alkoxyalkyl group is preferably a 1-ethoxyethyl group.

The position of —$OR^3$ group may be any of the o-, m- and p-positions, and is preferably the p-position from industrial points of view.

The silsesquioxane resin (A11) may contain a constituent unit (a4), which does not adversely affect the effects of the present invention, in addition to the constituent units (a1) to (a3).

Specific examples of the constituent unit (a4) include a constituent unit represented by the following general formula (IV):

(IV)

wherein $R^4$ represents a linear, branched or cyclic alkyl group having 1 to 15 carbon atoms.

With respect to the content of each constituent unit in the resin, the total content of the constituent units (a1) and (a2) is preferably 50% by mole or more based on the total amount of all constituent units of the silsesquioxane resin (A11). When the total content of the constituent units (a1) and (a2) is less than 50% by mole, solubility in the alkali developing step may be insufficient.

The constituent unit (a3) is a constituent unit which contributes to an improvement in heat resistance. When the content of the constituent unit (a3) in the silsesquioxane resin (A11) is less than 10%, an effect of improving heat resistance may not be exerted sufficiently. Therefore, the total content of the constituent units (a1) and (a2) is preferably 90% by mole or less.

Therefore, the total content of the constituent units (a1) and (a2) is preferably from 50 to 90% by mole, and more preferably from 60 to 80% by mole. The content of the constituent unit (a3) is preferably from 10 to 50% by mole, and more preferably 20 to 40% by mole.

The content of the constituent unit (a2) is preferably 8% by mole or more based on the total amount of the constituent units (a1) and (a2).

The smaller the content of the constituent unit (a2) based on the total amount of the constituent units (a1) and (a2), the more the dissolution inhibiting effect due to introduction of the acid dissociable dissolution inhibiting group ($R^3$) decreases. Therefore, a change in alkali solubility before and after the exposure of the silsesquioxane resin (A11) decreases. On the other hand, when the content of the constituent unit (a2) is too large, a portion of the acid dissociable dissolution inhibiting groups may remain without being completely dissociated after passing through the exposure and PEB steps. The acid dissociable dissolution inhibiting groups remaining without being completely dissociated may not be removed by rinsing, thereby causing defects. When the content of the constituent unit (a2) is large, the heat resistance of the component (A) may be lowered.

Therefore, the content of the constituent unit (a2) is preferably from about 8 to 25% by mole, and more preferably from about 10 to 20% by mole, based on the total amount of the constituent units (a1) and (a2).

If the shape of the desired resist pattern is a line-and-space pattern, larger content of the constituent unit (a3) in the silsesquioxane resin (A11) reduces line edge roughness, and thus the result is suited for fine working. In this case, the content of the constituent unit (a3) is preferably from 25 to 50% by mole, and more preferably from 30 to 40% by mole. The term "line edge roughness" as used herein refers to irregularity of the line side wall. 3σ as a measure of line edge roughness of the line-and-space pattern is a tripled value (3σ) of a standard deviation (σ) calculated from the results of the measurement of the width of the resist pattern of samples at 32 positions using a measuring SEM (manufactured by Hitachi, Ltd. under the trade name of "S-9220"). The smaller the value of 3σ, the less roughness the resulting resist pattern may have and the more uniform width.

If the shape of the desired resist pattern is a hole pattern, when the content of the constituent unit (a3) in the silsesquioxane resin (A11) is large, edge roughness of the hole pattern decrease, however, resolution may be lowered. Therefore, the content of the constituent unit (a3) is preferably from 25 to 35% by mole, and more preferably from 25 to 30% by mole.

When the silsesquioxane resin (A11) contains the other constituent unit (a4), the content is preferably 25% by mole or less, and more preferably 15% by mole or less.

The constituent unit (a3) or the constituent units (a3) and (a4) preferably constitute the remainder after the constituent units (a1) and (a2) at the silsesquioxane resin (A11), namely, 50% by mole or less. The silsesquioxane resin (A11) is preferably composed of only the constituent units (a1) to (a3) or the constituent units (a1) to (a4).

The polystyrene equivalent weight average molecular weight (Mw) determined using gel permeation chromatography (which hereinafter may be abbreviated to GPC) of the silsesquioxane resin (A11) is not specifically limited, but is preferably within a range from 2000 to 15000, and more preferably from 5000 to 10000. When the weight average molecular weight is more than the above range, solubility in an organic solvent may become worse. On the other hand, when the weight average molecular weight is less than the above range, a resist pattern profile may become worse.

The ratio Mw/number average molecular weight (Mn) is not specifically limited, but is preferably within a range from 1.0 to 6.0, and more preferably from 1.0 to 2.0. When the ratio is more than the above range, resolution and pattern shape may become worse.

The silsesquioxane resin (A11) in the present invention can be produced, for example, by obtaining a polymer comprising constituent units (a1) and (a3) or a polymer comprising constituent units (a1), (a3) and (a4) using the method described in Japanese Patent No. 2,567,984, and substituting a hydrogen atom of a phenolic hydroxyl group in a portion of the side chain of the constituent unit (a1) with an acid dissociable dissolution inhibiting group to form a constituent unit (a2) using a well-known technique.

As the monomer of the constituent unit (a4), alkyltrialkoxysilane or alkyltrichlorosilane can be used.

In the step of introducing an acid dissociable dissolution inhibiting group, a polymer comprising constituent units (a1), (a2) and (a3) or a polymer comprising constituent units (a1), (a2), (a3) and (a4) can be obtained by dissolving the above polymer in an organic solvent, adding a base or acid catalyst, or a compound corresponding to the acid dissociable dissolution inhibiting group, reacting the polymer solution at a temperature of about 20 to 70° C. for about 1 to 10 hours, adding an acid or base to the reaction solution, to thereby neutralize the reaction, and pouring the reaction solution into water with stirring to deposit a polymer. The base or acid catalyst may be used properly according to the compound corresponding to the acid dissociable dissolution inhibiting group.

The content of the constituent units (a1) and (a2) can be controlled according to the amount of the compound corresponding to the acid dissociable dissolution inhibiting group to be introduced.

Silsesquioxane Resin (A12)

The silsesquioxane resin (A12) comprises a constituent unit (a1) represented by the above general formula (I) and a constituent unit (a5) represented by the following general formula (V):

(V)

wherein $R^5$ represents a linear or branched alkylene group having 1 to 5 carbon atoms, $R^6$ represents an alkyl group having 1 to 5 carbon atoms, $R^7$ represents an alkyl group having 1 to 5 carbon atoms or a hydrogen atom, and $R^8$ represents an alicyclic hydrocarbon group having 5 to 15 carbon atoms.

In the silsesquioxane resin (A12), $R^1$ of the constituent unit (a1) is preferably a linear or branched alkylene group having 1 to 5 carbon atoms, and more preferably a linear or branched alkylene group having 1 to 3 carbon atoms, in view of the synthesis of the resin. The position of the hydroxyl group may be any of the o-, m- and p-positions, and is preferably the p-position from industrial points of view.

In the constituent unit (a5), similar to $R^1$, $R^5$ is preferably a linear or branched alkylene group having 1 to 5 carbon atoms, and more preferably a linear or branched alkylene group having 1 to 3 carbon atoms, in view of the synthesis of the resin.

$R^6$ is preferably a linear or branched alkyl group having 1 to 5 carbon atoms, and more preferably a methyl group or an ethyl group.

$R^7$ is preferably a linear or branched alkyl group having 1 to 5 carbon atoms or a hydrogen atom, and more preferably a hydrogen atom.

$R^8$ is preferably an alicyclic hydrocarbon group having 5 to 15 carbon atoms, more preferably a cycloalkyl group having 5 to 7 carbon atoms such as cyclopentyl group or cyclohexyl group, and most preferably a cyclohexyl group from industrial points of view because of its low price.

The functional group represented by the following general formula (VI) in the constituent unit (a5) functions as the acid dissociable dissolution inhibiting group.

Therefore, when a resist composition containing the silsesquioxane resin (A12) is applied onto a substrate and then exposed via a mask pattern, alkali solubility of the exposed area is enhanced and thus a resist pattern can be formed by alkali development.

(VI)

The position of the acid dissociable dissolution inhibiting group represented by general formula (VI) may be any of the o-, m- and p-positions, and is preferably the p-position from industrial points of view.

With respect to the content of each constituent unit in the resin, the total content of the constituent units (a1) and (a5) is preferably 50% by mole or more based on the total amount of all constituent units of the silsesquioxane resin (A12), and may be 100% by mole. When the total content of the constituent units (a1) and (a5) is less than 50% by mole, solubility in the alkali developing step may be insufficient. Therefore, the total content of the constituent units (a1) and (a5) is preferably from 50 to 90% by mole, and more preferably from 60 to 80% by mole.

The content of the constituent unit (a5) is preferably from 5 to 50% by mole, and more preferably from 5 to 15% by mole, based on the total amount of the constituent units (a1) and (a5). The smaller the content of the constituent unit (a5) based on the total amount of the constituent units (a1) and (a5), the more the dissolution inhibiting effect due to introduction of the acid dissociable dissolution inhibiting group decreases. Therefore, a change in alkali solubility before and after the exposure of the silsesquioxane resin (A12) decreases. On the other hand, when the content of the constituent unit (a5) is too large, a portion of the acid dissociable dissolution inhibiting groups may be remained without being completely dissociated after passing through the exposure and PEB steps. The acid dissociable dissolution inhibiting groups remaining without being completely dissociated may not be removed by rinsing, thereby causing defects. When the content of the constituent unit (a5) is large, the heat resistance of the component (A) may be lowered.

The silsesquioxane resin (A12) may further contain a constituent unit (a3) represented by general formula (III).

The constituent unit (a3) is not essential. However, when the silsesquioxane resin (A12) contains the constituent unit (a3), the heat resistance of the resist pattern is improved.

If the shape of the desired resist pattern is a line-and-space pattern, line edge roughness is effectively decreased when the silsesquioxane resin (A12) contains the constituent unit (a3). In this case, the content of constituent unit (a3) in the silsesquioxane resin (A12) is preferably from 20 to 50% by mole, and more preferably from 30 to 40% by mole.

The silsesquioxane resin (A12) may contain, in addition to the constituent units (a1), (a5) and (a3), the above-mentioned constituent unit (a4), as long as the incorporation of (a4) which does not adversely affect the effects of the present invention.

When the silsesquioxane resin (A12) contains the above or other constituent unit (a4), the content is preferably 20% by mole or less, and more preferably 15% by mole or less.

The constituent unit (a3) or the constituent units (a3) and (a4) preferably constitute the remainder after the constituent unit (a1) and (a5) of the silsesquioxane resin (A12), namely, 50% by mole or less. The silsesquioxane resin (A12) is preferably composed of only the constituent units (a1), (a5) and (a3) or the constituent units (a1), (a5), (a3) and (a4).

The weight average molecular weight (Mw) of the silsesquioxane resin (A12) is not specifically limited, but is preferably within a range from 2000 to 15000, and more preferably from 5000 to 10000. When the weight average molecular weight is more than the above range, solubility in an organic solvent may become worse. On the other hand, when the weight average molecular weight is less than the above range, a resist pattern profile may become worse.

The ratio Mw/Mn is not specifically limited, but is preferably within a range from 1.0 to 6.0, and more preferably from 1.0 to 2.0. When the ratio is more than the above range, resolution and pattern shape may become worse.

When the silsesquioxane resin (A12) in the present invention includes constituent units (a1) and (a5), it can be produced, for example, by obtaining a polymer including a constituent unit (a1) using a well-known polymerization method, and introducing an acid dissociable dissolution inhibiting group (VI) into a phenolic hydroxyl group in a portion of the side chain of the constituent unit (a1) to form a constituent unit (a5) using a well-known technique.

The silsesquioxane resin including constituent units (a1), (a5) and (a3) can be produced, for example, by obtaining a polymer including constituent units (a1) and (a3), as shown in synthesis examples described hereinafter, using the method described in Japanese Patent No. 2,567,984, and introducing an acid dissociable dissolution inhibiting group (VI) into a phenolic hydroxyl group in a portion of the side chain of the constituent unit (a1) using a well-known technique.

The silsesquioxane resin comprising constituent units (a1), (a5), (a3) and (a4) can be produced, for example, by obtaining a polymer comprising constituent units (a1), (a3) and (a4), and introducing an acid dissociable dissolution inhibiting group (VI) into a phenolic hydroxyl group in a portion of the side chain of the constituent unit (a1) using a well-known technique. As the monomer of the constituent unit (a4), alkyltrialkoxysilane or alkyltrichlorosilane can be used.

The step of introducing the acid dissociable dissolution inhibiting group (VI) comprises dissolving the polymer comprising the constituent unit (a1), the polymer comprising the constituent units (a1) and (a3) or the polymer comprising the constituent units (a1), (a3) and (a4) in an organic solvent, adding a base or acid catalyst, and a compound corresponding to the acid dissociable dissolution inhibiting group, reacting the polymer solution at a temperature of about 20 to 70° C. for about 1 to 10 hours, adding an acid or base to the reaction solution, to thereby neutralize the reaction, and pouring the reaction solution into water with stirring to deposit a polymer, and thus obtaining a polymer comprising the above respective constituent units and a constituent unit (a5) added thereto can be obtained. The base or acid catalyst may be used properly according to the compound corresponding to the acid dissociable dissolution inhibiting group (VI).

Silsesquioxane Resin (A21)

The silsesquioxane resin (A21) includes a constituent unit (a1) represented by the above general formula (I), a constituent unit (a7) represented by the following general formula (VII):

wherein $R^9$ represents a linear or branched alkylene group having 1 to 5 carbon atoms, and $R^{10}$ represents a linear or branched alkyl group having 1 to 5 carbon atoms, and a constituent unit (a3) represented by the above general formula (III).

In general formula (VII), similar to $R^1$, $R^9$ is preferably a linear or branched alkylene group having 1 to 5 carbon atoms, and more preferably a linear or branched alkylene group having 1 to 3 carbon atoms, in view of the synthesis of the resin.

$R^{10}$ is most preferably a methyl group.

The position of —$OR^{10}$ in the general formula (VII) may be at any of the o-, m- and p-positions, and is preferably the p-position from industrial points of view.

With respect to the content of these constituent units, the content of the constituent unit (a1) is preferably selected within a range from 10 to 70% by mole, and more preferably from 20 to 55% by mole; the content of the constituent unit (a7) is preferably selected within a range from 5 to 50% by mole, and more preferably from 10 to 40% by mole; and the constituent unit (a3) is preferably selected within a range from 10 to 60% by mole, and more preferably from 20 to 40% by mole.

The constituent unit (a7) has a function of adjusting solubility in an alkali, thereby to inhibit thickness loss and to prevent roundness of a resist pattern profile. It is advantageous that this constituent unit (a7) can be introduced with ease by inhibiting the dissociation degree of the alkoxy group because it is made from the same starting material as that of the constituent unit (a1).

The silsesquioxane resin (A21) may contain, in addition to the constituent units (a1), (a7) and (a3), the above-mentioned constituent unit (a4) which does not adversely affect the effects of the present invention.

When the silsesquioxane resin (A21) contains the above other constituent unit (a4), the content is preferably 20% by mole or less, and more preferably 15% by mole or less.

In the positive resist composition of the present invention, the rate of the silsesquioxane resin (A21) dissolved in an alkali may be adjusted from 0.05 to 50 nm/sec, and preferably 5.0 to 30 nm/sec, by adjusting the content of the constituent unit (a7) in the silsesquioxane resin (A21).

As used herein, the rate of the silsesquioxane resin (A21) dissolved in the alkali is a rate of dissolution in an aqueous 2.38 wt % TMAH (tetramethylammonium hydroxide) solution.

By adjusting to the dissolution rate of 50 nm/sec or less, thickness loss can be sufficiently inhibited and roundness of the resist pattern profile can be prevented. Also the effect of improving resolution and reducing defects can be exerted. By adjusting to the dissolution rate of 0.05 nm/sec or more, a resist composition can be obtained by dissolving in an organic solvent.

The dissolution rate can be adjusted by changing the content of the constituent unit (a7). For example, the dissolution rate can be decreased by increasing the content of the constituent unit (a7).

The rate of dissolution in the alkali is determined by the following procedure.

First, a solution prepared by dissolving the silsesquioxane resin (A21) in an organic solvent is applied onto a silicon wafer and the organic solvent is vaporized by a heating treatment [prebaking (PAB)] to form a resin coating film (thickness: 500 to 1300 nm, for example, thickness: 1000 nm). The organic solvent is appropriately selected from known organic solvents used in a chemically amplified photoresist composition as described hereinafter. The content of the silsesquioxane resin (A21) may be the same as that of the base resin in the resist composition, but is from 10 to 25% by weight, for example, 20% by weight. After measuring the thickness of the resin coating film, the wafer is immersed in an aqueous 2.38 wt % TMAH solution at 23° C. The time required to completely dissolve the resin film is measured and then thickness loss per unit time (nm/second) of the resin coating film is determined from the resulting time.

The resulting thickness loss of the resin coating film is a dissolution rate of the silsesquioxane resin (A21).

The weight average molecular weight (Mw) of the silsesquioxane resin (A21) is not specifically limited, but is preferably within a range from 1500 to 20000. When the weight average molecular weight is more than the above range, solubility in an organic solvent may become worse. On the other hand, when the weight average molecular weight is less than the above range, a resist pattern profile may become worse.

The ratio Mw/Mn is not specifically limited, but is preferably within a range from 1.0 to 6.0, and more preferably from 1.0 to 2.0. When the ratio is more than the above range, resolution and pattern shape may become worse.

Component (B)

A feature of the present invention is that the component (B) contains an onium salt-based acid generator (B1) containing a perfluoroalkyl sulfonate ion having 3 or 4 carbon atoms as an anion.

Mask linearity is improved by mixing the onium salt-based acid generator (B1) in combination with the component (A).

It is considered that mask linearity is improved because the onium salt-based acid generator has such characteristics that, as the number of carbon atoms of the anion (acid) increases, the acid strength decreases and the distance of diffusion in the resist film increases.

In a conventional positive resist composition, in order to sufficiently dissociate the acid dissociable dissolution inhibiting group in the exposed area, thereby to increase a difference in alkali solubility with the non-exposed area, an onium salt-based acid generator containing, as an anion, a C1 perfluoroalkyl sulfonate ion having high acid strength is mainly used. However, in the case of forming an Iso line pattern and a L&S pattern using a mask having the same line width, it is necessary to form the L&S pattern by increasing an exposure dose as compared with the case of forming the Iso line pattern taking into account an influence of the proximity effect. Therefore, when the Iso line pattern is formed at the exposure dose used to form the L&S pattern, the exposure dose increases and a large amount of an acid is generated, and thus the line width decreases. This phenomenon arises more remarkably as the acid strength increases and the diffusion distance of the acid decreases. That is, this phenomenon arises more remarkably as the number of carbon atoms of the anion decreases.

Therefore, there may be a concept that an onium salt-based acid generator containing a perfluoroalkyl sulfonate ion having a large number of carbon atoms as an anion is used as the component (B). However, as the number of carbon atoms increases, the acid strength decreases and the diffusion distance increases. Therefore, resist characteristics become worse, for example, DOF and exposure margin decrease in the case of forming a resist pattern and a pattern shape becomes worse, and now the onium salt-based acid generator is not substantially used.

In the present invention, mask linearity can be improved by using the onium salt-based acid generator (B1) in combination with the component (A). In this case, an adverse influence is not exerted on DOF, exposure margin and pattern shape.

In the onium salt-based acid generator (B1), the perfluoroalkyl sulfonate ion having 3 or 4 carbon atoms can be represented by the following general formula (VIII):

$$C_pF_{2p+1}SO_3^- \tag{VIII}$$

wherein p represents 3 or 4.

The alkyl group of the perfluoroalkyl sulfonate ion having 3 or 4 carbon atoms may be linear or branched, but is preferably linear. Taking account of the influence exerted on the solubility in the organic solvent, and environment, the alkyl group preferably has 3 carbon atoms.

The cation of the onium salt-based acid generator (B1) is not specifically limited and may be a cation of a known acid generator proposed in a conventional chemically amplified resist composition.

Examples of the cation include a sulfonium ion and an iodonium ion, for example, a sulfonium ion represented by the following general formula (IX).

$$\begin{array}{c} R^{11} \\ | \\ R^{12}-S^+ \\ | \\ R^{13} \end{array} \tag{IX}$$

In general formula (IX), $R^{11}$ to $R^{13}$ each independently represents an aryl group or an alkyl group.

Among $R^{11}$ to $R^{13}$, at least one substituent is preferably an aryl group. Among $R^{11}$ to $R^{13}$, at least two substituents are more preferably aryl group groups. Most preferably, all of $R^{11}$ to $R^{13}$ are aryl groups.

Examples of aryl groups as $R^{11}$ to $R^{13}$ include, but are not limited to, aryl groups having 6 to 20 carbon atoms which may be phenyl group or naphthyl group which may have a substituent of an alkyl group or a halogen atom thereon. Among these, an aryl group having 6 to 10 carbon atoms is preferable because the synthesis can be conducted at a low cost. Examples of the alkyl group which may be a substituent on the aryl group include, but are not limited to, a linear or branched alkyl group having 1 to 5 carbon atoms. Examples of the halogen atom, which may be a substituent on the aryl group, include chlorine atom, fluorine atom, iodine atom and bromine atom.

Examples of the alkyl group as $R^{11}$ to $R^{13}$ include, but are not limited to, a linear, branched or cyclic alkyl group having 1 to 10 carbon atoms. In view of excellent definition, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group and a decanyl group. Among these groups, a methyl group is preferable because it is excellent in definition and can be synthesized at a low cost.

Among these groups, at least one of $R^{11}$ to $R^{13}$ is preferably a phenyl group which may be substituted by an alkyl group such as methyl group, and all of them are preferably phenyl groups which may be substituted by an alkyl group.

Specific examples of the onium salt-based acid generator (B1) include nonafluorobutane sulfonate of diphenyliodonium, nonafluorobutane sulfonate of bis(4-tert-butylphenyl)iodonium, heptafluoropropane sulfonate of triphenylsulfonium or its nonafluorobutane sulfonate or (4-methylphenyl)diphenylsulfoniumnonafluorobutane sulfonate, heptafluoropropane sulfonate of tri(4-methylphenyl)sulfonium or its nonafluorobutane sulfonate, heptafluoropropane sulfonate of dimethyl(4-hydroxynaphthyl)sulfonium or its nonafluorobutane sulfonate, heptafluoropropanesulfonate of monophenyldimethylsulfonium or its nonafluorobutane sulfonate, and heptafluoropropane sulfonate of diphenylmonomethylsulfonium or its nonafluorobutane sulfonate. Among these, heptafluoropropane sulfonate of triphenylsulfonium or its nonafluorobutane sulfonate or (4-methylphenyl)diphenylsulfoniumnonafluorobutane sulfonate is preferable.

These onium salt-based acid generators (B1) may be used alone or in combination.

In the component (B), the total content of the onium salt-based acid generator (B1) is preferably from 50 to 100% by weight, and more preferably from 60 to 100% by weight, based on the entire component (B). When the content is 50% by weight or more, the effects of the present invention are exerted sufficiently.

In the present invention, the component (B) may further contain known acid generators used in a conventional chemically amplified resist composition. Examples of the acid generator include those other than the onium salt-based acid generator (B1), for example, onium salt-based acid generators such as iodonium salt and sulfonium salt; oximesulfonate-based acid generators; diazomethane-based acid generators such as bisalkyl or bisarylsulfonyldiazomethanes, poly(bissulfonyl)diazomethanes, and diazomethanenitrobenzylsulfonates; iminosulfonate-based acid generators; and disulfone-based acid generators.

Specific examples of the onium salt-based acid generator other than the onium salt-based acid generator (B1) include trifluoromethane sulfonate of diphenyliodonium, trifluoromethane sulfonate of bis(4-tert-butylphenyl)iodonium, trifluoromethane sulfonate of triphenylsulfonium, (4-methylphenyl)diphenylsulfonium trifluoromethane sulfonate, (4-methoxyphenyl)diphenylsulfonium trifluoromethane sulfonate, tri(4-tert-butylphenyl)sulfonium trifluoromethane sulfonate, trifluoromethane sulfonate of tri(4-methylphenyl)sulfonium, trifluoromethane sulfonate of dimethyl(4-hydroxynaphthyl)sulfonium, trifluoromethane sulfonate of monophenyldimethylsulfonium, and trifluoromethane sulfonate of diphenylmonomethylsulfonium. Among these, an onium salt containing a fluoroalkyl sulfonate ion as an anion is preferable.

In the present invention, it is preferred that the component (B) further contains an onium salt-based acid generator (B2) containing a C1 perfluoroalkyl sulfonate ion as an anion. Consequently, the amount of the entire component (B) can be decreased and this is advantageous in view of cost.

The cation of the onium salt-based acid generator (B2) is not specifically limited and may be the same as that listed as the cation of the onium salt-based acid generator (B1).

When the onium salt-based acid generator (B2) is used in combination as the component (B), the content of the onium salt-based acid generator (B2) in the component (B) is preferably less than 50% by weight, and more preferably from 20 to 40% by weight.

The ratio (weight ratio) of the onium salt-based acid generator (B1) to the onium salt-based acid generator (B2) is preferably from 9:1 to 5:5, and more preferably from 9:1 to 6:4.

Specific examples of the oximesulfonate-based acid generator include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile and α-(methylsulfonyloxyimino)-p-bromophenylacetonitrile. Among these, α-(methylsulfonyloxyimino)-p-methoxyphenylacetonitrile is preferable.

Among the diazomethane-based acid generators, specific examples of the bisalkyl or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane.

Examples of the poly(bissulfonyl)diazomethanes include those having the following structures, for example, 1,3-bis(phenylsulfonyldiazomethylsulfonyl)propane (compound A, decomposition point: 135° C.), 1,4-bis(phenylsulfonyldiazomethylsulfonyl)butane (compound B, decomposition point: 147° C.), 1,6-bis(phenylsulfonyldiazomethylsulfonyl)hexane (compound C, melting point: 132° C., decomposition point: 145° C.), 1,10-bis(phenylsulfonyldiazomethylsulfonyl)decane (compound D, decomposition point: 147° C.), 1,2-bis(cyclohexylsulfonyldiazomethylsulfonyl)ethane (compound E, decomposition point: 149° C.), 1,3-bis(cyclohexylsulfonyldiazomethylsulfonyl)propane (compound F, decomposition point: 153° C.), 1,6-bis(cyclohexylsulfonyldiazomethylsulfonyl)hexane (compound G, melting point: 109° C., decomposition point: 122° C.) and 1,10-bis(cyclohexylsulfonyldiazomethylsulfonyl)decane (compound H, decomposition point: 116° C.).

COMPOUND A

COMPOUND B

COMPOUND C

-continued

COMPOUND D

COMPOUND E

COMPOUND F

COMPOUND G

COMPOUND H

These acid generators may be used alone or in combination.

The onium salt-based acid generator is preferably used in combination with the diazomethane-based acid generator in the content of 10 to 80% by weight based on the weight of the onium salt-based acid generator because line edge roughness in the contact hole decreases.

The content of the component (B) is from 0.5 to 30 parts by weight, and preferably from 1 to 10 parts by weight, based on 100 parts by weight of the component (A). When the content is less than the above range, a pattern may not be sufficiently formed. On the other hand, when the content is larger than the above range, a uniform solution may not be obtained with ease and thus storage stability may be lowered.

Component (C)

The positive resist composition of the present invention can optionally contain, in addition to the essential components (A) and (B), a low molecular weight dissolution inhibitor (C) having an acid dissociable dissolution inhibiting group, the acid dissociable dissolution inhibiting group being dissociated by an action of an acid (hereinafter referred to as a component (C)). In the case in which the positive resist composition contains, as the component (A), an alkali soluble resin component (A2) such as silsesquioxane resin (A21), it is necessary to mix with the component (C). Mixing with the component (C) can improve rectangularity, resolution and line edge roughness of the pattern.

The molecular weight of the component (C) is preferably 300 to 3000, and more preferably from 500 to 2000.

As the component (C), there can be used known dissolution inhibitors which have already been used in a chemically amplified positive resist composition, and examples thereof include a phenol compound having a phenolic hydroxyl group protected with an acid dissociable dissolution inhibiting group, and a carboxyl compound having a carboxyl group protected with an acid dissociable dissolution inhibiting group. As used herein, "protected" means that the hydrogen atom in at least one hydroxyl group of the phenolic hydroxyl group and the carboxyl group is substituted by an acid dissociable dissolution inhibiting group.

Examples of phenol compounds having a phenolic hydroxyl group, which can constitute the component (C) by being protected with the acid dissociable dissolution inhibiting group, include polyphenol compounds having 3 to 5 phenol groups, for example, a triphenylmethane-based compound, a bis(phenylmethyl)diphenylmethane-based compound, and a 1,1-diphenyl-2-biphenylethane-based compound, each having a hydroxyl group as a nucleus substitution group. Also di- to hexanuclear compounds obtained by formalin condensation of at least one phenols selected from among phenol, m-cresol, and 2,5-xylenol can be used.

Examples of carboxyl compounds having a carboxyl group, which can constitute the component (C) by being protected with the acid dissociable dissolution inhibiting group, include biphenylcarboxylic acid, naphthalene(di)carboxylic acid, benzoylbenzoic acid and anthracenecarboxylic acid.

Examples of acid dissociable dissolution inhibiting groups for protecting the hydroxyl group or the carboxyl group in these phenol compounds or carboxyl compounds include tertiary butyloxycarbonyl groups such as a tertiary butyloxycarbonyl group and a tertiary amyloxycarbonyl group; tertiary alkyl groups such as a tertiary butyl group and a tertiary amyl group; tertiary alkoxycarbonylalkyl groups such as a tertiary butyloxycarbonylmethyl group and a tertiary amyloxycarbonylmethyl group; and cyclic ether groups such as a tetrahydropyranyl group and a tetrahydrofuranyl group.

A preferable compound as the component (C) is produced by protecting a tetranuclear compound, obtained by condensing 2,5-xylenol with a formalin condensate, with a tertiary alkoxycarbonylalkyl group.

These components (C) may be used alone or in combination.

The content of the component (C) in the positive resist composition of the present invention is preferably from 0.5 to 40 parts by weight, and more preferably from 10 to 30 parts by weight, based on 100 parts by weight of the component (A). When the content is less than 0.5 parts by weight, sufficient dissolution inhibiting effect may not be obtained. On the other hand, when the content is more than 40 parts by weight, the pattern shape may become worse or lithography characteristics may become worse, and therefore it is not preferred.

Component (D)

The positive resist composition of the present invention can further contain, as an optional component, a nitrogen-containing organic compound (D) (hereinafter referred to as a component (D)) so as to improve resist pattern shape and post exposure stability of the latent image formed by the pattern wise-exposure of the resist layer.

Since various compounds have already been proposed as the component (D), it may be appropriately selected from known compounds. Among these compounds, amine, particularly secondary lower aliphatic amine and tertiary lower aliphatic amine are preferable.

As used herein, the term "lower aliphatic amine" refers to an amine of an alkyl or alkyl alcohol having 5 or less carbon atoms, and examples of the secondary or tertiary amine include trimethylamine, diethylamine, triethylamine, di-n-propylamine, tri-n-propylamine, tripentylamine, diethanolamine, triethanolamine and triisopropanolamine. Among these, tertiary alkanolamines such as triethanolamine and triisopropanolamine are preferable.

These amines may be used alone or in combination.

The component (D) is usually used within a range from 0.01 to 5.0 parts by weight based on 100 parts by weight of the component (A).

Component (E)

The positive resist composition of the present invention can further contain, as an optional component, an organic carboxylic acid or oxo acid of phosphorus or its derivative (E) (hereinafter referred to as a component (E)) so as to prevent deterioration of sensitivity due to mixing with the component (D) and to improve resist pattern shape and post-exposure stability of the latent image formed by the pattern-wise exposure of the resist layer. The component (D) and the component (E) can be used alone or in combination.

The organic carboxylic acid is preferably malonic acid, citric acid, malic acid, succinic acid, benzoic acid or salicylic acid.

Examples of the oxo acid of phosphorus or its derivative include phosphoric acid or its derivative such as an ester, for example, phosphoric acid, phosphoric acid di-n-butyl ester or phosphoric acid diphenyl ester; phosphonic acid or its derivative such as an ester, for example, phosphonic acid, phosphonic acid dimethyl ester, phosphonic acid-di-n-butyl ester, phenylphosphonic acid, phosphonic acid diphenyl ester or phosphonic acid dibenzyl ester; and phosphinic acid or its derivative such as an ester, such as phosphinic acid or phenylphosphinate. Among these, malonic acid is preferable.

The content of the component (E) is from 0.01 to 5.0 parts by weight based on 100 parts by weight of the component (A).

Other Optional Components

If necessary, the positive resist composition of the present invention can further contain miscible additives, for example, additive resins for improving performances of the resist film, surfactants for improving coatability, dissolution inhibitors, plasticizers, stabilizers, colorants and antihalation agents.

Organic Solvent

The positive resist composition of the present invention can be produced by dissolving the above-mentioned materials such as components (A) and component (B) in an organic solvent.

The organic solvent may be any one which can dissolve the respective components to form a uniform solution, and one or more kinds of any organic solvents can be appropriately selected from those which have conventionally been known as the solvent for a chemically amplified resist.

Examples thereof include γ-butyrolactone; ketones such as acetone, methyl ethyl ketone, cyclohexanone, methyl isoamyl ketone and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol and monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate and ethyl ethoxypropionate.

These organic solvents may be used alone or in combination.

In the present invention, a solvent mixture of propylene glycol monomethyl ether (PGME) and a solvent having a boiling point higher than that of PGME is preferably used. Consequently, resist pattern shape such as line edge roughness or line width roughness (non-uniformity of width of line) is improved. Also, depth of focus (DOF) in a contact hole is widened.

The solvent having a boiling point higher than that of PGME is preferably a solvent having a boiling point higher than 120° C. as the boiling point of PGME, more preferably a solvent having a boiling point which is 20° C. or more higher than that of PGME, and still more preferably a solvent having a boiling point which is 25° C. or more higher than that of PGME. The upper limit of the boiling point is not specifically limited, but is preferably about 250° C. or lower. Examples of the solvent include propylene glycol monomethyl ether acetate (boiling point: 146° C.), EL (boiling point: 155° C.) and γ-butyrolactone (boiling point: 204° C.). Among these solvents, EL is preferable.

The content of PGME in the solvent mixture is preferably from 10 to 60% by weight, and more preferably from 20 to 40% by weight, based on the entire solvent mixture. When the content is within the above range, excellent effects are exerted.

The content of the organic solvent is not specifically limited and is appropriately set to the content which enables application of the resulting coating solution onto the substrate, according to the thickness of the coating film. It is preferably set so that the solid content of the resist composition is within a range from 2 to 20% by weight, and preferably from 5 to 15% by weight.

When using a solvent mixture of PGME and a high-boiling point solvent as the organic solvent, since a rigid film can be formed in case of small solid content of the resin, the solid content can be decreased and thus a film having sufficient etching resistance can be obtained.

As described above, the use of the positive resist composition of the present invention makes it possible to form a resist pattern with good mask linearity. Also excellent DOF and exposure margin are attained in the case of forming a resist pattern. Furthermore, the resist pattern thus formed is excellent in shape.

The positive resist composition of the present invention can be preferably used for a method of patterning a support using a two-layer resist.

A resist laminate used as the two-layer resist will now be described.

Resist Laminate

The resist laminate comprises a support, a lower organic layer, which is insoluble in an alkali developer solution and is dry-etchable, and an upper resist layer made of the positive resist composition of the present invention, the lower organic layer and the upper resist layer being laminated on the support.

The support is not specifically limited and a conventionally known one can be used. Examples thereof include substrate for electronic components, and substrate having a predetermined wiring pattern formed thereon.

Examples of the substrate include silicon wafer, substrate made of metal such as copper, chromium, iron or aluminum, and glass substrate.

As the material for wiring pattern, for example, copper, aluminum, nickel and gold can be used.

The lower organic layer is an organic film which is insoluble in an alkali developer solution used in the development after exposure, and is etchable by a dry etching method.

By using such a lower organic layer, only the upper resist layer is subjected to exposure and alkali development by conventional photolithography to form a resist pattern, and then the resist pattern of the upper resist layer is transferred to the lower organic layer by dry-etching the lower organic layer via the resist pattern as a mask. Consequently, a resist pattern having a high aspect ratio can be formed without causing pattern falling of a resist pattern.

The organic film material for forming the lower organic layer does not necessarily have a photosensitivity like that of the upper resist layer. A resist composition or resin, which is generally used as a base material in the production of semiconductor devices and light crystal display devices, may be used as the organic film material.

Since the upper layer resist pattern must be transferred to the lower layer, the lower organic layer is preferably made of a material which is etchable with oxygen plasma.

As the material, for example, materials containing at least one selected from the group consisting of novolak resin, acrylic resin and soluble polyimide as a main component are preferably used because they are easily etchable with oxygen plasma and are excellent in resistance to a fluorocarbon gas used for etching of a silicon substrate in the post-process.

Among these materials, a novolak resin, and an acrylic resin having an alicyclic moiety or an aromatic ring in the side chain are preferably used because they are inexpensive and are widely used, and are also excellent in dry etching resistance in the post-process.

As the novolak resin, those used generally in the positive resist composition can be used, and also a positive resist for i-ray or g-ray, containing a novolak resin as a main component can be used.

The novolak resin is a resin obtained by addition condensation of an aromatic compound having a phenolic hydroxyl group (hereinafter referred to as "phenols") and aldehydes in the presence of an acid.

Examples of phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinonemonomethyl ether, pyrogallol, fluoroglycinol, hydroxydiphenyl, bisphenol A, gallic acid, gallate ester, α-naphthol and α-naphthol.

Examples of aldehydes include formaldehyde, furfural, benzaldehyde, nitrobenzaldehyde and acetaldehyde.

Although the catalyst used in the addition condensation reaction is not specifically limited, hydrochloric acid, nitric acid, sulfuric acid, formic acid, oxalic acid and acetic acid may be used as acid catalysts.

The weight average molecular weight of the novolak resin is preferably within a range from 5000 to 50000, more preferably from 6000 to 9000, and still more preferably from 7000 to 8000. When the weight average molecular weight is less than 5000, the novolak resin may cause sublimation when baked at high temperature. On the other hand, when the weight average molecular weight is more than 50000, it may become impossible to perform dry etching, and therefore it is not preferred.

The novolak resin, which can be used in the present invention, is commercially available and is preferably a novolak resin which has a content of a low molecular weight component having a molecular weight of 500 or less, preferably 200 or less, of 1% by weight or less, preferably 0.8% by weight or less, determined using gel permeation chromatography. The smaller the content of the low molecular weight component, the better. The content is preferably 0% by weight.

The "low molecular weight component having a molecular weight of 500 or less" is detected as a low-molecular fraction having a molecular weight of 500 or less when analyzed by a GPC method using polystyrene standards. The "low molecular weight component having a molecular weight of 500 or less" includes a non-polymerized monomer, and those having low polymerization degree, for example, those obtained by condensing 2 to 5 molecules of phenols with aldehydes, although it varies depending on the molecular weight.

The content (% by weight) of the low molecular weight component having a molecular weight of 500 or less is measured by plotting a fraction number (abscissa) versus a concentration (ordinate) of the analysis results obtained by the GPC method to form a graph, and determining a ratio (%) of the area under the curve of the low molecular weight component having a molecular weight of 500 or less to the entire area under the curve.

With respect to the meaning and the method for measurement of the content of the "low molecular weight component having a molecular weight of 200 or less", "500" may be replaced by "200" in the meaning and the method for measurement of the content of the "low molecular weight component having a molecular weight of 500 or less"

By adjusting Mw of the novolak resin to 50000 or less, excellent embedding into a substrate having fine irregularity is attained. By adjusting Mw of the novolak resin to 5000 or more, etching resistance to a fluorocarbon gas is obtained, and therefore it is preferred.

When the content of the low molecular weight component having a molecular weight of 500 or less is 1% by weight or less, excellent embedding into a substrate having fine irregularity is attained. The reason is not clear, but it is considered that the dispersion degree decreases.

As the acrylic resin, there can be used those which are generally used in positive resist compositions. The acrylic resin includes, for example, an acrylic resin comprising a constituent unit derived from a polymerizable compound having an ether bond, and a constituent unit derived from a polymerizable compound having a carboxyl group.

Examples of polymerizable compounds having an ether bond include (meth)acrylic acid derivatives having an ether bond and an ester bond, such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate and tetrahydrofurfuryl (meth)acrylate. These compounds can be used alone or in combination.

Examples of the polymerizable compound having a carboxyl group include monocarboxylic acids such as acrylic acid, methacrylic acid and crotonic acid; dicarboxylic acids such as maleic acid, fumaric acid and itaconic acid; and compounds having a carboxyl group and an ester bond, such as 2-methacryloyloxyethylsuccinic acid, 2-methacryloyloxyethylmaleic acid, 2-methacryloyloxyethylphthalic acid and 2-methacryloyloxyethylhexahydrophthalic acid. Among these compounds, acrylic acid and methacrylic acid are preferable. These compounds can be used alone or in combination.

The soluble polyimide is a polyimide which can be formed into liquid by using the organic solvent described above.

In the resist laminate of the present invention, in view of throughput balance taking account of the objective aspect ratio and the time required for dry etching of the lower organic layer, the total thickness of the upper resist layer and the lower organic layer is preferably 15 μm or less, and more preferably 5 μm or less. The lower limit of the total thickness is not specifically limited, but is preferably 0.1 μm or more, and more preferably 0.35 μm or more.

The thickness of the upper resist layer is preferably from 50 to 1000 nm, more preferably from 50 to 800 nm, and still more preferably from 100 to 500 nm. By adjusting the thickness of the upper resist layer within the above range, there can be exerted such effects that a resist pattern can be formed with high resolution and sufficient resistance to dry etching can be obtained.

The thickness of the lower organic layer is preferably within a range from 300 to 10000 nm, more preferably from 300 nm to 8000 nm, and still more preferably from 400 to 5000 nm. By adjusting the thickness of the lower organic layer within the above range, there can be exerted such effects that a resist pattern having a high aspect ratio can be formed and sufficient etching resistance can be secured when the substrate is etched.

In the present invention, the resist laminate includes a laminate in which the resist pattern is formed on the upper resist layer and the lower organic layer, and a laminate in which the resist pattern is not formed on the upper resist layer and the lower organic layer.

Method for Formation of Resist Pattern

The method for formation of a resist pattern using such a resist laminate can be conducted by the following procedure.

First, a resist composition or solution for formation of a lower organic layer is applied onto a substrate such as a silicon wafer using a spinner, and then subjected to a baking treatment under heating conditions of a temperature of 200 to 300° C. for 30 to 300 seconds, preferably 60 to 180 seconds to form a lower organic layer.

An organic or inorganic anti-reflection film may be provided between the lower organic layer and the upper resist layer.

The positive resist composition of the present invention is applied onto the lower organic layer using a spinner, and it is then prebaked under the conditions of a temperature of 70 to 150° C. for 40 to 180 seconds, preferably 60 to 90 seconds to form an upper resist layer, and thus a resist laminate of the present invention is obtained. To prevent the occurrence of white edge, it is effective to set the heating temperature within a range from about 70 to 90° C.

This resist laminate is selectively exposed to a KrF excimer laser or the like via a desired mask pattern using a KrF aligner or the like, and then subjected to PEB (post-exposure baking) under the conditions of a temperature of 70 to 150° C. for 40 to 180 seconds, preferably 60 to 90 seconds.

Then, the resist laminate is subjected to a development treatment with an alkali developer solution, for example, 0.05 to 10% by weight, preferably 0.05 to 3% by weight of an aqueous tetramethylammonium hydroxide solution. Consequently, it is made possible to form a resist pattern (I), which is faithful to the mask pattern on the upper resist layer.

As the light source used for exposure, KrF excimer laser and an electron beam are particularly useful. However, radiation such as ArF excimer laser light, $F_2$ excimer laser light, an EUV (extreme ultraviolet ray), a VUV (vacuum ultraviolet ray), electron beam (EB), an X-ray and a soft X-ray are also useful. When using an electron beam (EB), selective irradiation with electron beam via a mask, or drawing may be carried out.

Using the resulting resist pattern (I) as a mask pattern, dry etching of the lower organic layer is conducted to form a resist pattern (II) on the lower organic layer.

As the dry etching method, there can be used known methods, for example, chemical etching methods such as downflow etching and chemical dry etching; physical etching methods such as spatter etching and ion beam etching; and chemical and physical etching methods such as RIE (reactive ion etching).

The most popular dry etching method is the parallel-plate RIE method. According to this method, a resist laminate is placed in a chamber of an RIE system and a required etching gas is introduced. When a high frequency voltage is applied to a holder of the resist laminate disposed in parallel to an upper electrode in the chamber, the gas is converted into plasma. In the plasma, charged particles such as positive or negative ions or electrons, and neutral active species exist. When these etching species are adsorbed onto the lower organic layer, a chemical reaction arises and the reaction product is eliminated from the surface and then discharged, and thus etching proceeds.

Examples of the etching gases include oxygen gas and sulfur dioxide gas. Among these etching gasses, oxygen gas is preferably used because the etching with oxygen plasma secures high resolution, and also the silsesquioxane resin (A1) of the present invention shows high etching resistance to oxygen plasma and is widely used.

As described above, a resist pattern comprising a resist pattern (I) and a resist pattern (II) laminated one upon another is obtained. A fine pattern can be formed on a support by etching via the resulting resist pattern as a mask.

As the etching method, for example, an etching method using a halogen-based gas can be preferably used.

According to the method of forming a resist pattern of the present invention, since the resist composition constituting the upper resist layer is excellent in mask linearity, it is made possible to faithfully realize patterns with good Iso/Dense balance and various sizes. Moreover, an adverse influence is not exerted on DOF, exposure margin and pattern shape.

EXAMPLES

The present invention will now be described by way of examples; however, the scope of the present invention is not limited to the following examples.

Synthesis Example 1

Synthesis Example of Silsesquioxane Resin (A12)

In a 500 ml three-necked flask equipped with a stirrer, a reflux condenser, a dropping funnel and a thermometer, 84.0 g (1.0 mol) of sodium hydrogencarbonate and 400 ml of water were charged and a mixed solution of 51.1 g (0.20 mol) of p-methoxybenzyltrichlorosilane, 21.1 g (0.10 mol) of phenyltrichlorosilane and 100 ml of diethyl ether was added dropwise over 2 hours from a dropping funnel, followed by aging for one hour. After the completion of the reaction, the reaction mixture was extracted with ether and the ether was distilled off under reduced pressure. To the resulting hydrolysate, 0.2 g of a 10 wt % solution of potassium hydroxide was added, followed by heating at 200° C. for 2 hours to obtain a copolymer $A_1$ of p-methoxybenzylsilsesquioxane and phenylsilsesquioxane.

Then, 50 g of resulting copolymer $A_1$ was dissolved in 150 ml of acetonitrile and 80 g (0.40 mol) of trimethylsilyliodine was added. After stirring under reflux for 24 hours, 50 ml of water was added and the solution was reacted by stirring under reflux for 12 hours. After cooling, free iodine was reduced with an aqueous sodium hydrogensulfite solution and the organic layer was separated. After the solvent was distilled off under reduced pressure, the resulting polymer was reprecipitated from acetone and n-hexane and then dried with heating under reduced pressure to obtain a copolymer $A_2$ comprising 70% by mole of p-hydroxybenzylsilsesquioxane and 30% by mole of phenylsilsesquioxane.

Then, 40 g of the resulting copolymer $A_2$ was dissolved in 200 ml of tetrahydrofuran (THF) and 1.0 g of p-toluenesulfonic acid monohydrate as the acid catalyst and 6.5 g of cyclohexyl vinyl ether were added, and the mixture was reacted under the conditions of a temperature of 23° C. for about 3 hours. While stirring, the reaction solution was poured into water to deposit a polymer to obtain 40 g of a silsesquioxane resin (X1) represented by the following chemical formula (X). In the formula, l:m:n=55% by mole: 15% by mole:30% by mole, and the weight average molecular weight of the resin is 7600.

(X)

Example 1

100 Parts by weight of the silsesquioxane resin (X1) obtained in Synthesis Example 1 was dissolved in 950 parts by weight of ethyl lactate and then 3.73 parts by weight of triphenylsulfonium heptafluoropropanesulfonate as the component (B), 0.328 parts by weight of triethanolamine as the component (D), 0.081 parts by weight of malonic acid as the component (E) and 20 parts by weight of a low molecular weight dissolution inhibitor (DI22) represented by the following chemical formula (XI) as the component (C) were added to prepare a positive resist composition. The silicon content of the positive resist composition was about 13% by weight based on the entire solid content.

R represents a —CH$_2$COO-tert-butyl group

Example 2

In the same manner as Example 1, except that 3.92 parts by weight of triphenylsulfonium nonafluorobutanesulfonate was used as the component (B), a positive resist composition was prepared. The silicon content of the positive resist composition was about 13% by weight based on the entire solid content.

Example 3

In the same manner as Example 1, except that 4.19 parts by weight of (4-methylphenyl)diphenylsulfonium nonafluorobutanesulfonate was used as the component (B), a positive resist composition was prepared. The silicon content of the positive resist composition was about 13% by weight based on the entire solid content.

Example 4

In the same manner as Example 1, except that 1.20 parts by weight of triphenylsulfonium trifluoromethanesulfonate and 2.24 parts by weight of triphenylsulfonium heptafluoropropanesulfonate were used as the component (B), a positive resist composition was prepared. The silicon content of the positive resist composition was about 13% by weight based on the entire solid content.

Example 5

In the same manner as Example 1, except that 1.20 parts by weight of triphenylsulfonium trifluoromethanesulfonate and 2.35 parts by weight of triphenylsulfonium nonafluorobutanesulfonate were used as the component (B), a positive resist composition was prepared. The silicon content of the positive resist composition was about 13% by weight based on the entire solid content.

Comparative Example 1

In the same manner as Example 1, except that 3.00 parts by weight of triphenylsulfonium trifluoromethanesulfonate was used as the component (B), a positive resist composition was prepared. The silicon content of the positive resist composition was about 13% by weight based on the entire solid content.

Test Example 1

The positive resist compositions obtained in Examples 1 to 5 and Comparative Example 1 were subjected to the following evaluation tests.

(1) Evaluation of Mask Reproducibility (Mask Linearity)

TBLC-100 (a resin containing a novolak resin; manufactured by Tokyo Ohka Kogyo Co., Ltd.) as a base film material was applied onto a silicon substrate using a spinner, and then subjected to a baking treatment at 230° C. for 90 seconds to form a base film having a thickness of 425 nm.

The positive resist composition obtained previously was applied onto the base film using a spinner, and then subjected to a baking treatment at 85° C. for 90 seconds to form a resist film having a thickness of 150 nm.

Then, the resist film was selectively irradiated by a KrF excimer laser (248 nm) via a halftone type (transmittance: 6%) mask pattern using a KrF aligner NSR—S203B (manufactured by Nikon Corporation; NA (numerical aperture) =0.68, 2/3 zonal illumination).

The resist film was subjected to a PEB treatment under the conditions of a temperature of 95° C. for 90 seconds, and then subjected to a development treatment with an aqueous 2.38% wt % tetramethylammonium hydroxide solution at 23° C. for 60 seconds to obtain a line-and-space (L&S) pattern.

A profile of the resulting L&S pattern having a line width of 120 nm and a ratio of line width/space width of 1:1 was observed by a scanning electron microscope (SEM) and an optimum exposure dose (Eop) at L&S (1:1) was determined.

As a result, in all positive resist compositions, a good pattern was obtained.

In the same manner, a resist pattern was formed by changing the size of mask (L&S, 1:1) from 120 to 300 nm in the exposure dose (Eop) determined above, and the size of the resist pattern thus formed was measured.

Figure 1:
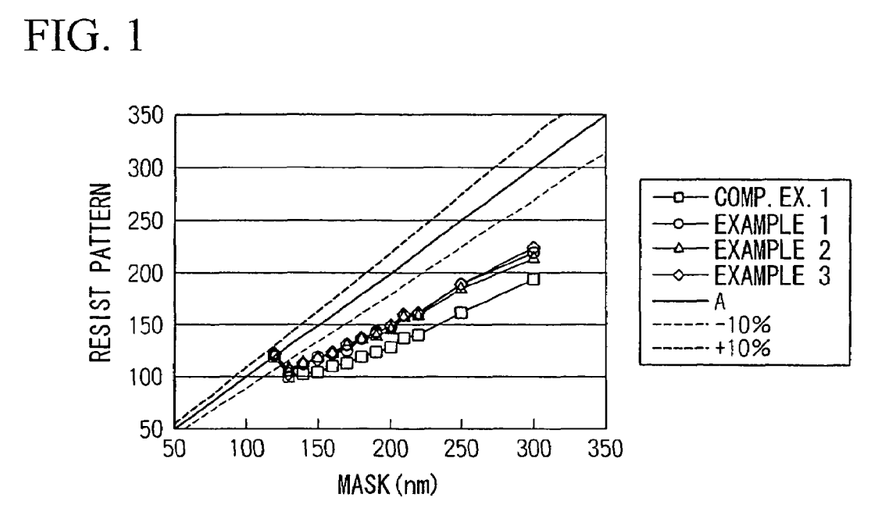
FIG. 1 is a graph showing the evaluation results of mask linearity of Examples 1 to 3 and Comparative Example 1.

The results of Examples 1 to 3 and Comparative Example 1 are shown in FIG. 1. As is apparent from these results, in Examples 1 to 3, resist patterns, which are more faithful to the mask as compared with Comparative Example 1, were formed.

Figure 2:
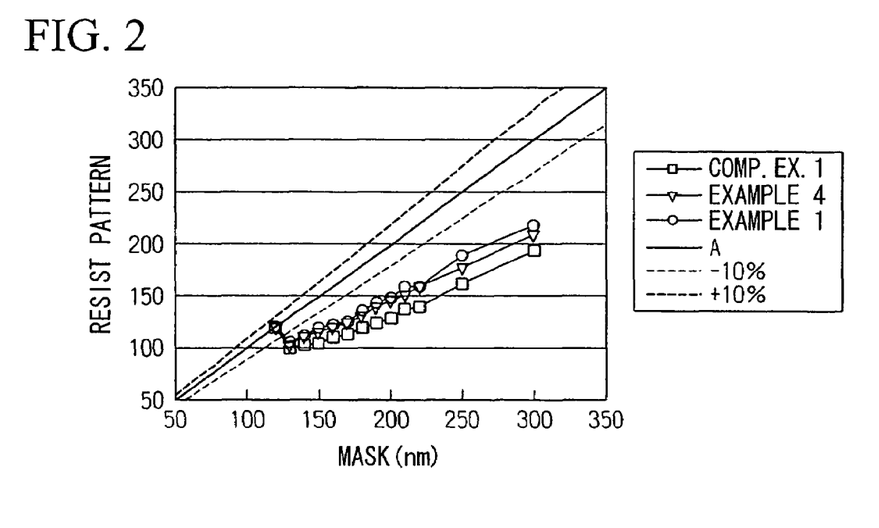
FIG. 2 is a graph showing the evaluation results of mask linearity of Examples 1 and 4 and Comparative Example 1.
Figure 3:
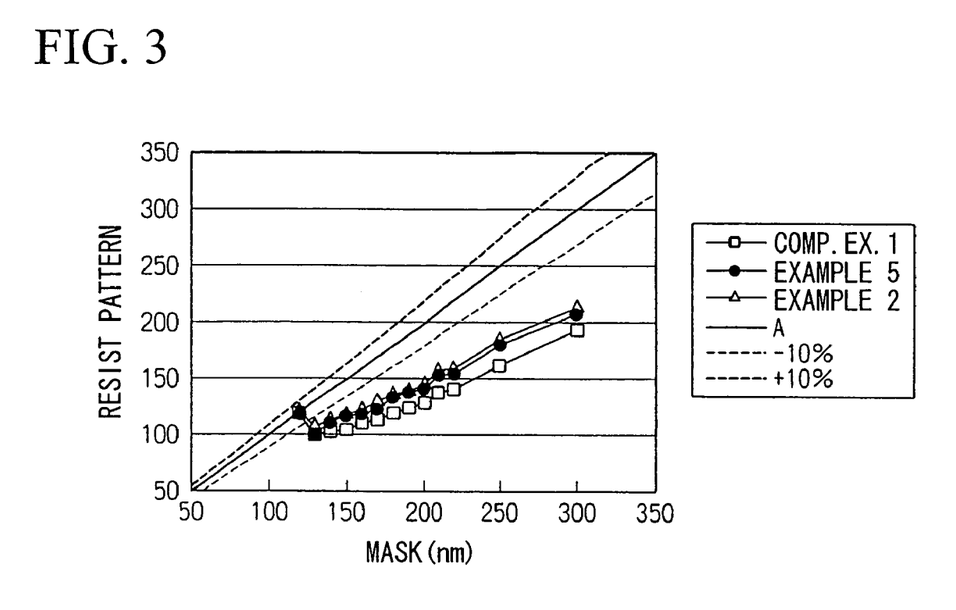
FIG. 3 is a graph showing the evaluation results of mask linearity of Examples 2 and 5 and Comparative Example 1.

The results of Examples 1 and 4 and Comparative Example 1 are shown in FIG. 2, and the results of Examples 2 and 5 and Comparative Example 1 are shown in FIG. 3. As is apparent from these results, in Examples 4 and 5 where a mixture with the compound having 1 carbon atom is used, resist patterns, which are more faithful to the mask as compared with Comparative Example 1, were formed.

In graphs shown in FIGS. 1 to 3, the abscissa denotes a mask size (space width, m), the ordinate denotes a resist pattern size (line width, m), the straight line A denotes a line in which resist pattern size=mask size, two broken lines denotes a line in which resist pattern size=mask size+10%. The closer to the straight line A, the better the mask reproducibility becomes.

(2) Evaluation of Iso/Dense Balance (Proximity Effect)

In the same manner as described above, an L&S pattern having a line width of 120 nm was formed by forming a Dense pattern having a ratio line width/space width of 120:120 and an Iso pattern having a pattern distance of 120:144 at the same exposure dose (Eop), respectively. As a result, both patterns could be formed in Examples 1 to 5, while the Iso pattern could not be formed in Comparative Example 1 because the resist was not remained at the position where the Iso pattern should be formed.

(3) Evaluation of DOF

In the exposure dose (Eop) determined in (1), focus was shifted up and down and a resist pattern was formed in the same manner as described above and then the depth of focus, at which a L&S pattern (line width: 120 nm, 1:1) is obtained with a predetermined size ±10% (132 nm to 108 nm), was determined. As a result, the depth of focus was 0.6 μm in Comparative Example 1, while the depth of focus was 0.7 μm in Example 1, 0.7 μm in Example 2, 0.6 μm in Example 3, 0.7 μm in Example 4 and 0.7 μm in Example 5, and thus the results equal to or better than those of Comparative Example 1 were obtained.

(4) Exposure Margin

In the same manner as described above, an exposure dose margin, at which a line-and-space pattern (1:1) having a line width of 120 nm can be formed within an error range of ±10%, was determined. As a result, exposure dose margin was about 8% in Comparative Example 1 and Examples 1 to 5.

As described above, the positive resist compositions of Examples 1 to 5 were excellent in mask reproducibility and Iso/Dense balance and were also excellent in mask linearity. In this case, an adverse influence was not exerted on DOF, exposure margin and resist pattern shape.

What is claimed is:

1. A positive resist composition comprising a base resin component (A) and an acid generator component (B) generating an acid under exposure, wherein the base resin component (A) is a silicone resin, and the acid generator component (B) contains an onium salt-based acid generator (B1) containing a perfluoroalkyl sulfonate ion having 3 or 4 carbon atoms as an anion wherein the base resin component (A) is a resin component (A1) having an acid dissociable dissolution inhibiting group, the dissolution inhibiting group being dissociated by action of an acid thereby to enhance alkali solubility; and wherein the resin component (A1) contains a silsesquioxane resin (A12) comprising a constituent unit (a1) represented by the following general formula (I):

(I)

wherein $R^1$ represents a linear or branched alkylene group having 1 to 5 carbon atoms; a constituent unit (a5) represented by the following general formula (V):

(V)

wherein R⁵ represents a linear or branched alkylene group having 1 to 5 carbon atoms, R⁶ represents an alkyl group having 1 to 5 carbon atoms, R⁷ represents an alkyl group having 1 to 5 carbon atoms or a hydrogen atom, and R⁸ represents an alicyclic hydrocarbon group having 5 to 15 carbon atoms; and a constituent unit (a3) represented by the following general formula (III):

(III)

wherein the total content of the constituent units (a1) and (a5) is 50% by mole or more based on the total amount of all constituent units of the silsesquioxane resin (A12), and the content of the constituent unit (a5) is 5% by mole or more and 50% by mole or less based on the total amount of the constituent units (a1) and (a5); and the content of constituent unit (a3) in the silsesquioxane resin (A12) is from 20 to 50% by mole.

2. The positive resist composition according to claim 1, wherein the onium salt-based acid generator component (B1) is an onium salt-based acid generator containing a perfluoroalkyl sulfonate ion having 3 carbon atoms as an anion.

3. The positive resist composition according to claim 1, wherein the acid generator component (B) further contains an onium salt-based acid generator (B2) containing a perfluoroalkyl sulfonate ion having 1 carbon atom as an anion.

4. The positive resist composition according to claim 1, which further comprises a low molecular weight dissolution inhibitor (C) having an acid dissociable dissolution inhibiting group, the acid dissociable dissolution inhibiting group being dissociated by an action of an acid.

5. The positive resist composition according to claim 4, wherein the low molecular weight dissolution inhibitor (C) is a phenol compound having a phenolic hydroxyl group protected with an acid dissociable dissolution inhibiting group, or a carboxyl compound having a carboxyl group protected with an acid dissociable dissolution inhibiting group.

6. The positive resist composition according to claim 1, which further comprises a nitrogen-containing organic compound (D).

7. A positive resist composition according to claim 1, wherein the silsesquioxane resin (A12) further comprising a constituent unit (a4) represented by the following general formula (IV):

(IV)

wherein R⁴ represents a linear, branched or cyclic alkyl group having 1 to 15 carbon atoms.

8. A positive resist composition according to claim 1, wherein the silsesquioxane resin (A12) consist of constituent units (a1), (a5) and (a3).

9. A positive resist composition according to claim 1, wherein the silsesquioxane resin (A12) consists of constituent units (a1), (a5), (a3) and a constituent unit (a4) represented by the following general formula (IV):

(IV)

wherein R4 represents a linear, branched or cyclic alkyl group having 1 to 15 carbon atoms.

* * * * *